United States Patent
Jhang

(10) Patent No.: US 7,319,073 B2
(45) Date of Patent: Jan. 15, 2008

(54) METHOD OF REDUCING SILICON DAMAGE AROUND LASER MARKING REGION OF WAFERS IN STI CMP PROCESS

(75) Inventor: You-Di Jhang, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 264 days.

(21) Appl. No.: 11/160,919

(22) Filed: Jul. 15, 2005

(65) Prior Publication Data

US 2007/0015368 A1   Jan. 18, 2007

(51) Int. Cl.
*H01L 21/311* (2006.01)
*H01L 21/76* (2006.01)

(52) U.S. Cl. .............. 438/700; 438/401; 438/687; 257/E21.232

(58) Field of Classification Search ............ 438/700; 257/E21.232

See application file for complete search history.

(56) References Cited

U.S. PATENT DOCUMENTS 6,181,018 B1 * 1/2001 Saino ................ 257/797
6,194,287 B1 * 2/2001 Jang ................. 438/427
6,368,937 B1 * 4/2002 Nakamura ............ 438/401
2004/0033689 A1 * 2/2004 Ho et al. ............. 438/687
2004/0185637 A1 * 9/2004 Fu et al. ............. 438/401
2005/0158966 A1 * 7/2005 Fang et al. ........... 438/427

\* cited by examiner

*Primary Examiner*—Asok K. Sarkar
*Assistant Examiner*—Igwe U. Anya
(74) *Attorney, Agent, or Firm*—Winston Hsu

(57) ABSTRACT

A wafer has thereon a plurality of integrated circuit die areas, scribe line that surrounds each of the integrated circuit die areas, and a laser marking region having therein a laser marking feature. A pad layer is formed on the wafer. AA photoresist pattern is formed on the pad layer. The AA photoresist pattern includes trench openings that expose STI trench areas within the integrated circuit die areas and dummy openings that merely expose a transitioning region of the laser-marking region. The pad layer and the substrate are etched through the trench openings and dummy openings, to form STI trenches within the integrated circuit die areas and dummy trenches in the transitioning region. A trench fill dielectric is deposited over the wafer and fills the STI trenches and the dummy trenches. Using the pad nitride layer as a polish stop layer, chemical mechanical polishing the trench fill dielectric.

8 Claims, 14 Drawing Sheets

METHOD OF REDUCING SILICON DAMAGE AROUND LASER MARKING REGION OF WAFERS IN STI CMP PROCESS

BACKGROUND OF THE INVENTION

1. Field of the Invention

The present invention relates generally to the field of semiconductor fabrication and, more particularly, to a method of reducing silicon damage that occurs during shallow trench isolation (STI) CMP process around a laser mark region of a semiconductor wafer.

2. Description of the Prior Art

As known in the art, modern semiconductor integrated circuits are fabricated at the surface of a wafer of semiconductor material such as single-crystal silicon. Each circuit, which is referred to as a "die" when in chip form, is at a position within an array of die at the wafer surface, so as to be fabricated simultaneously with the other die on that wafer. Since some manufacturing processes, such as thermal oxide growth, cleanups, and the like are performed simultaneously for multiple wafers, the wafers are also generally grouped into lots during the manufacturing processes. Other processes, such as photolithography, plasma etching, and the like are generally performed on a wafer-by-wafer basis.

In the manufacture of integrated circuits, it has become commonplace to mark wafers with some type of identifier, generally a lot identifier and a wafer identifier. These identifiers are conventionally marked on the front surface of the wafer (i.e., the wafer surface at which the integrated circuits are being formed). A typical method of marking the lot identifier on a semiconductor wafer is by laser marking, where the laser locally melts the semiconductor in a pattern corresponding to the lot number and wafer number.

Please refer to FIG. 1 and FIG. 2. FIG. 1 is a plan view showing laser mark region 12, wafer edge exposure (WEE) and edge bead removal (EBR) regions on a typical wafer 10. FIG. 2 is an enlarged view showing portions of the integrated circuit die areas 22 and wafer 10 adjacent to the laser mark region 12 of FIG. 1. As shown in FIG. 1 and FIG. 2, the laser marking of wafer 10 is conventionally made in a notched region (hereinafter referred to as "laser-marking region") 12 at the front surface of the wafer 10. Typically, the laser-marking region 12 bounds on the scribe line 24 that surrounds each integrated circuit die area 22, and the boundary between the laser-marking region 12 and the scribe line 24 is about 6.5 millimeters (mm) away from the wafer rim 40. The laser-marking region 12 is disposed at the wafer edge so as not to disrupt the formation of integrated circuits. Typically, a wafer notch 14 is formed within the laser-marking region 12.

In FIG. 2, ordinarily, an EBR border 30, which is about 1.5 mm away from the wafer rim 40, and the WEE border 20, which is about 2.5 mm away from the wafer rim 40 are provided. It is known that photoresist and anti-reflective coating (if applied) within an annular peripheral region between the EBR border 30 and the wafer rim 40 are typically chemically washed away during lithographic process for reducing contamination risk. Photoresist within an annular peripheral region or WEE region between the WEE border 20 and the wafer rim 40 is exposed to light and then removed from the wafer periphery after development. Further, integrated circuit components, features or patterns are typically not formed in the redundancy substrate area 26 at the left-hand side of the laser mark region 12 and in the redundancy substrate area 28 at the right-hand side of the laser mark region 12.

Please refer to FIGS. 3-7. FIGS. 3-7 are schematic cross-sectional diagrams showing portions of the integrated circuit die area 22 and the laser-marking region 12 of the wafer 10 along line I-I of FIG. 2 during the fabrication of shallow trench isolation (STI) regions in accordance with the prior art method. In the fabrication of STI regions, a so-called active area (AA) photoresist is patterned and used as a trench dry etching mask. As shown in FIG. 3, a laser marking feature 50, generally a lot identifier and a wafer identifier, is provided in the semiconductor substrate 100 within the laser-marking region 12 of the wafer 10. A pad oxide layer 62 is formed over the semiconductor substrate 100. A pad nitride layer 64 is then deposited on the pad oxide layer 62.

As shown in FIG. 4, using conventional lithographic process, a layer of AA photoresist pattern 70 is formed on the pad nitride layer 64. The AA photoresist pattern 70 comprises openings 72 that expose STI trench areas within the integrated circuit die area 22 to be etched into the semiconductor substrate 100, and an opening 74 that exposes the entire laser-marking region 12. The entire laser-marking region 12 is opened along with the previously described WEE region.

As shown in FIG. 5, using the AA photoresist pattern 70 as an etching hard mask, a dry etching process is carried out to etch the exposed pad nitride layer 64, pad oxide layer 62 and semiconductor substrate 100 through the openings 72 and 74 so as to form STI trenches 82 within the integrated circuit die area 22 and trench 84 within the laser-marking region 12. After this, the remaining AA photoresist pattern 70 is stripped off. As shown in FIG. 6, trench fill material 88 such as chemical vapor deposition (CVD) oxide is deposited over the semiconductor substrate 100 to fill the trenches 82 and 84.

As shown in FIG. 7, using the pad nitride layer 64 as a polish stop, a conventional STI chemical mechanical polishing (CMP) process is carried out to remove excess trench fill material 88 outside the STI trench. During the STI CMP process, it is desirable to completely remove the trench fill oxide disposed directly above the pad nitride layer 64 (or referred to as "active-area oxide") such that the pad nitride layer 64 can be stripped off in the following nitride strip process.

Insufficient active-area oxide removal usually hampers the removal of the pad nitride layer 64, potentially causing yield degradation. To ensure the complete removal of the trench fill oxide disposed directly above the pad nitride layer 64, an over-polish or etching step is usually carried out. However, such over-polish or etching leads to defects such as excessive pad nitride erosion, trench oxide loss, scratches and silicon damage as indicated by numeral number 92. In practical cases, severe silicon damage has been observed in the dashed line region 90 as specifically indicated in FIG. 2.

SUMMARY OF THE INVENTION

It is the primary object of the present invention to provide an improved method of fabricating semiconductor integrated circuits in order to solve the above-mentioned prior art problems.

It is another object of the present invention to provide a method of reducing silicon damage and other defects that occurs during shallow trench isolation (STI) CMP process around a laser mark region of a semiconductor wafer.

It is still another object of the present invention to provide a method for widen the STI CMP process window during the fabrication of semiconductor integrated circuits.

According to the claimed invention, a method of reducing silicon damage around laser marking region of wafers in shallow trench isolation (STI) chemical mechanical polishing (CMP) process is disclosed. A wafer is provided. The wafer has thereon a plurality of integrated circuit die areas, scribe line that surrounding each of the integrated circuit die areas, and a laser marking region having therein a laser marking feature. The laser marking region is disposed at wafer edge and bounds on the scribe line. A pad oxide layer is formed on the wafer. A pad nitride layer is formed on the pad oxide layer. An active area (AA) photoresist pattern is formed on the pad nitride layer. The AA photoresist pattern comprises trench openings that expose STI trench areas within the integrated circuit die areas to be etched into a substrate of the wafer, and dummy openings that merely expose a transitioning region of the laser-marking region. Using the AA photoresist pattern as etching hard mask, the pad nitride layer, the pad oxide layer and the substrate are etched through the trench openings and dummy openings, so as to form STI trenches within the integrated circuit die areas and dummy trenches in the transitioning region of the laser-marking region. The AA photoresist pattern is removed. A trench fill dielectric is then deposited over the wafer. The trench fill dielectric fills the STI trenches and the dummy trenches. A reverse mask having an opening exposing the laser-marking region except the transitioning region is formed. The trench fill dielectric is etched back through the opening of the reverse mask to reduce thickness of the trench fill dielectric above the laser marking feature. The reverse mask is removed. Using the pad nitride layer as a polish stop layer, chemical mechanical polishing the trench fill dielectric.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
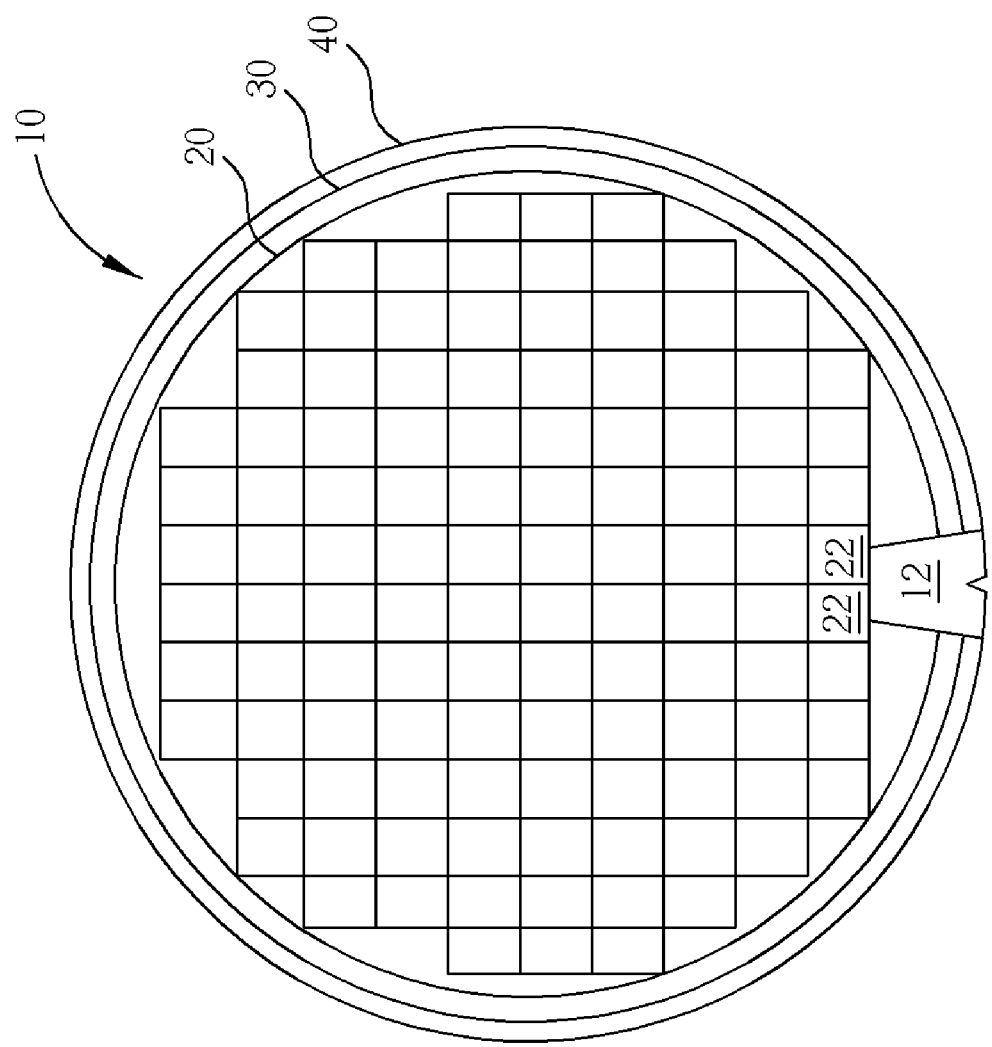
FIG. 1 is a plan view showing laser mark region, wafer edge exposure (WEE) and edge bead removal (EBR) regions on a typical wafer.
Figure 2:
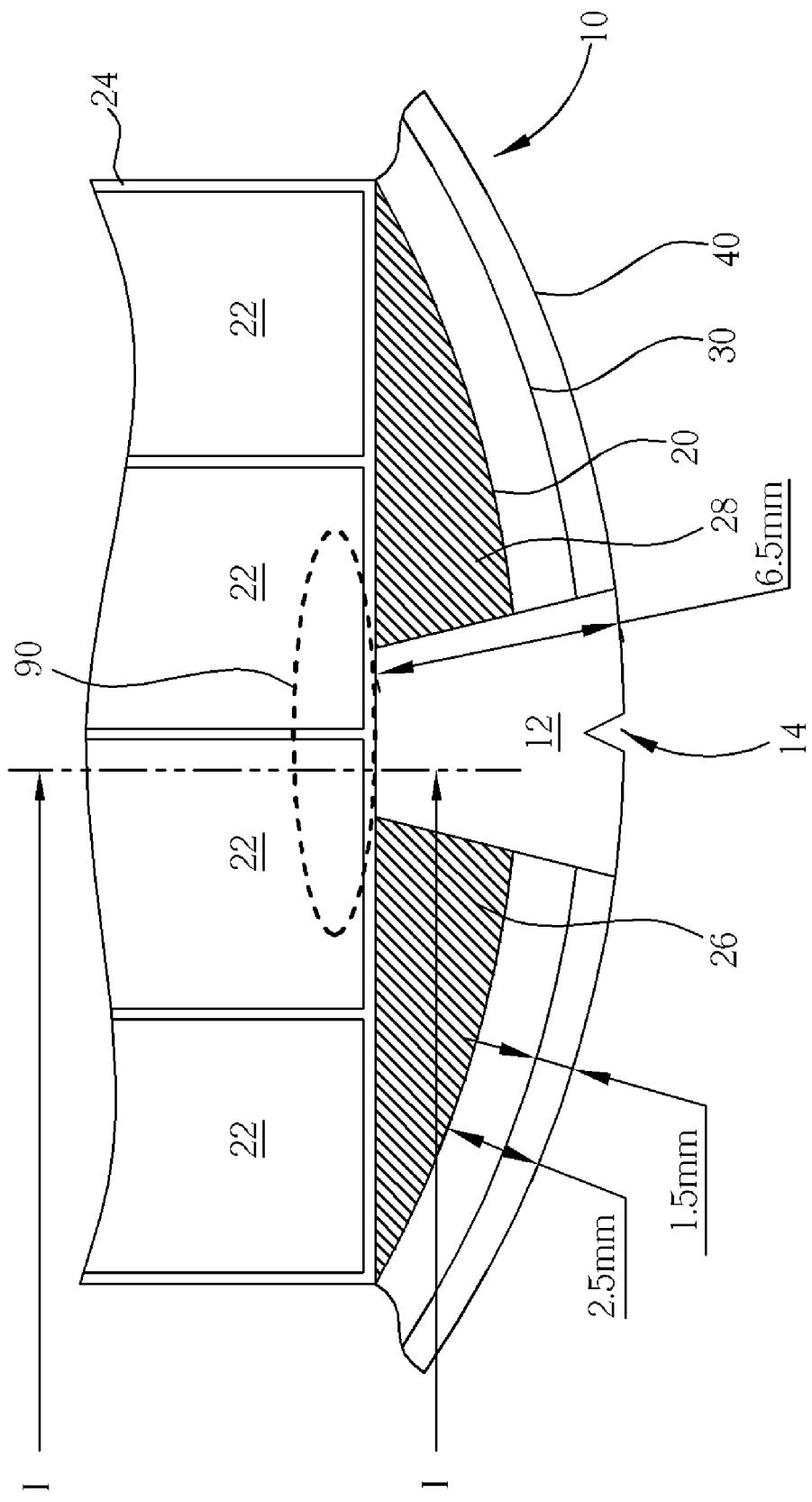
FIG. 2 is an enlarged view showing portions of the integrated circuit die areas and wafer adjacent to the laser mark region of FIG. 1.
Figure 3:
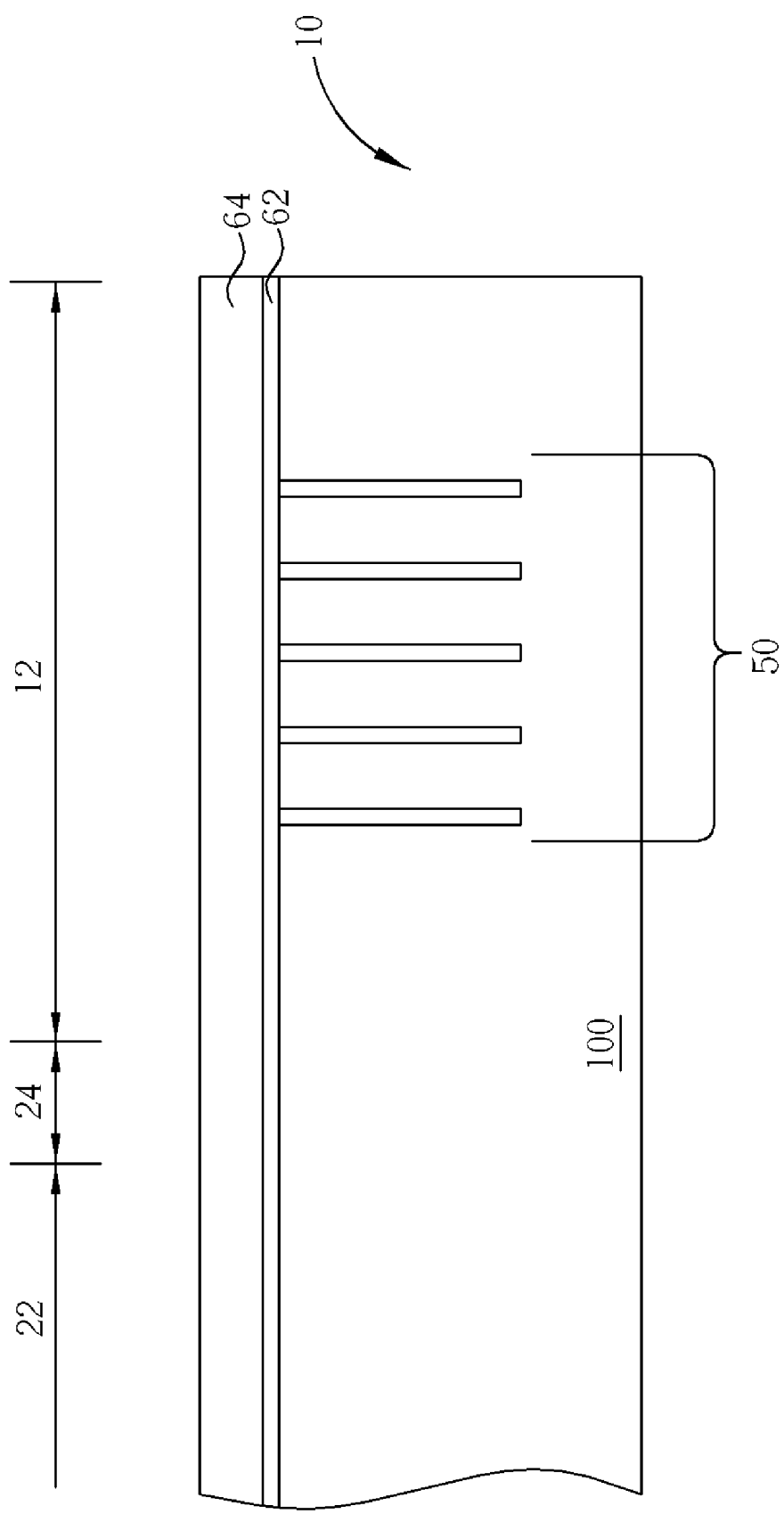
FIGS. 3-7 are schematic cross-sectional diagrams showing portions of the integrated circuit die area and the laser-marking region of the wafer along line I-I of FIG. 2 during the fabrication of shallow trench isolation (STI) regions in accordance with the prior art method.
Figure 4:
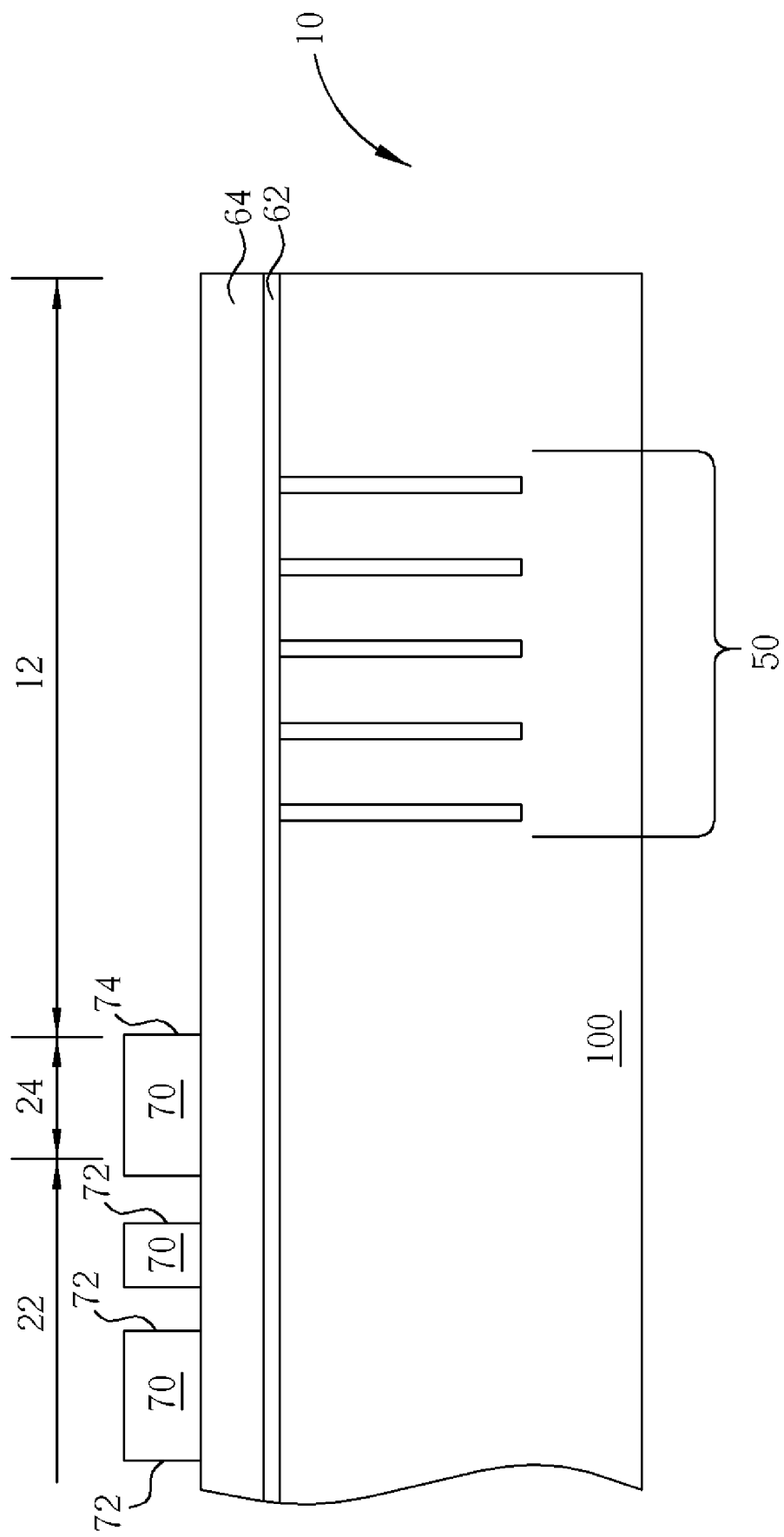
Figure 5:
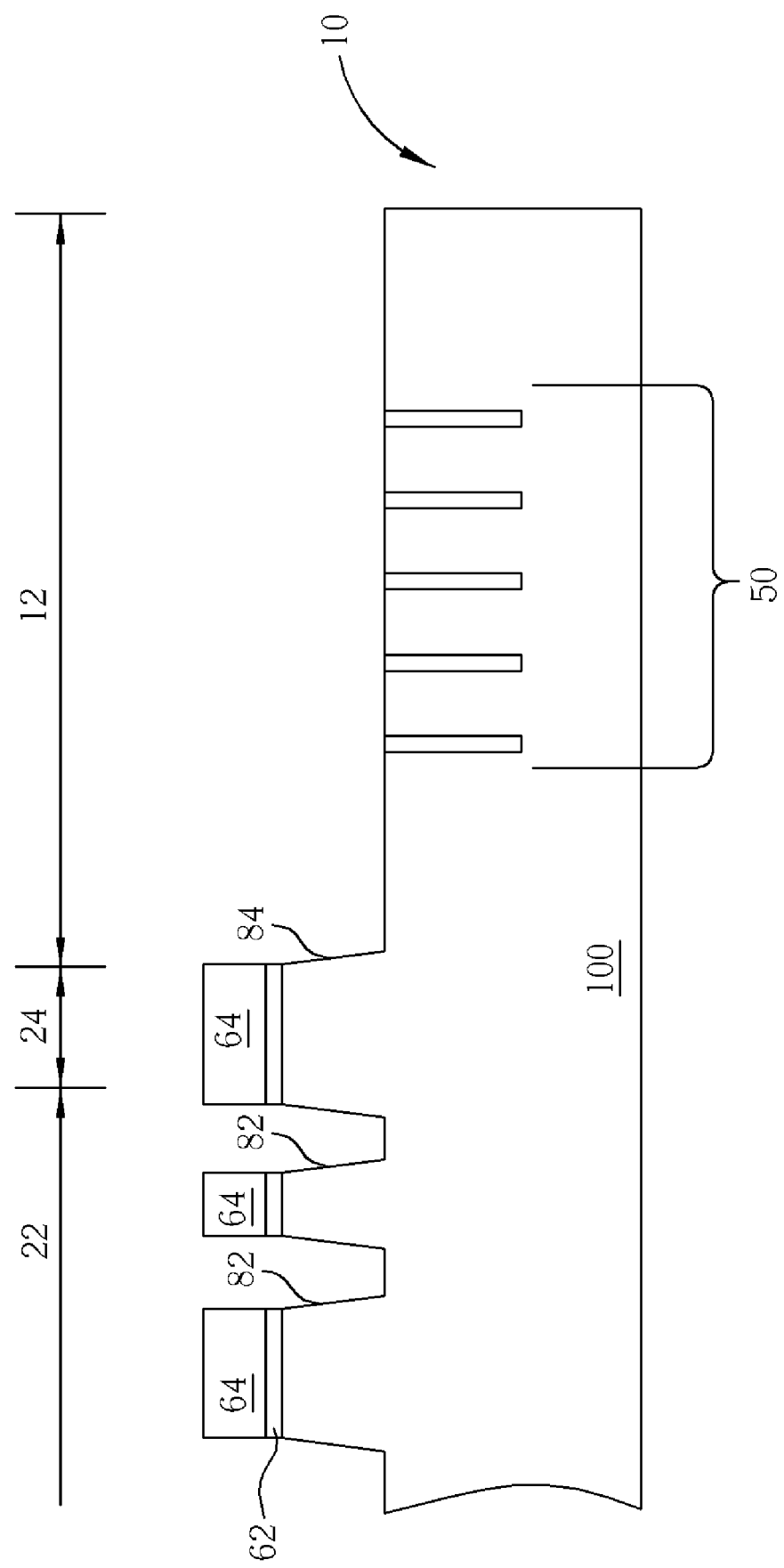
Figure 6:
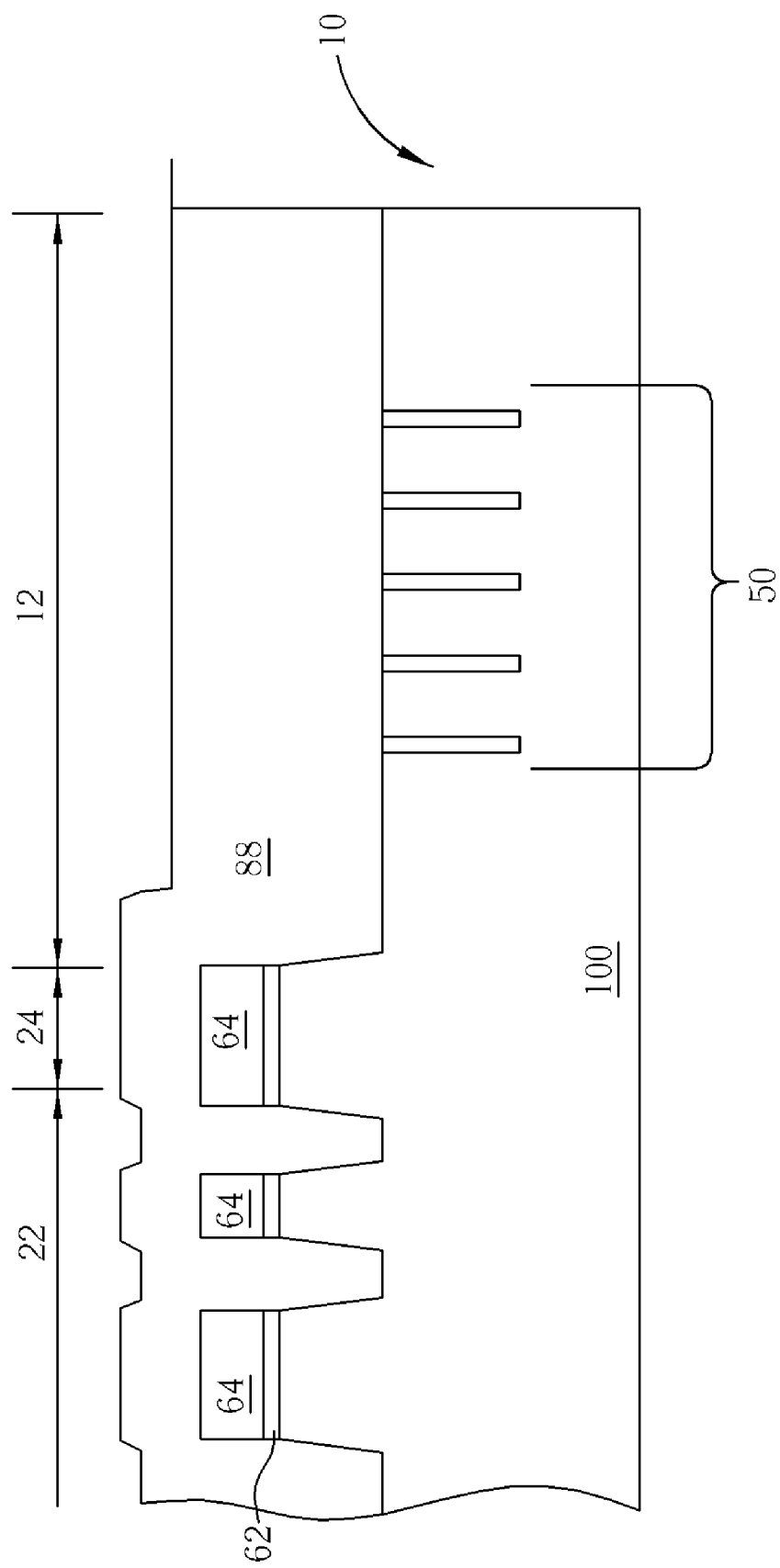
Figure 7:
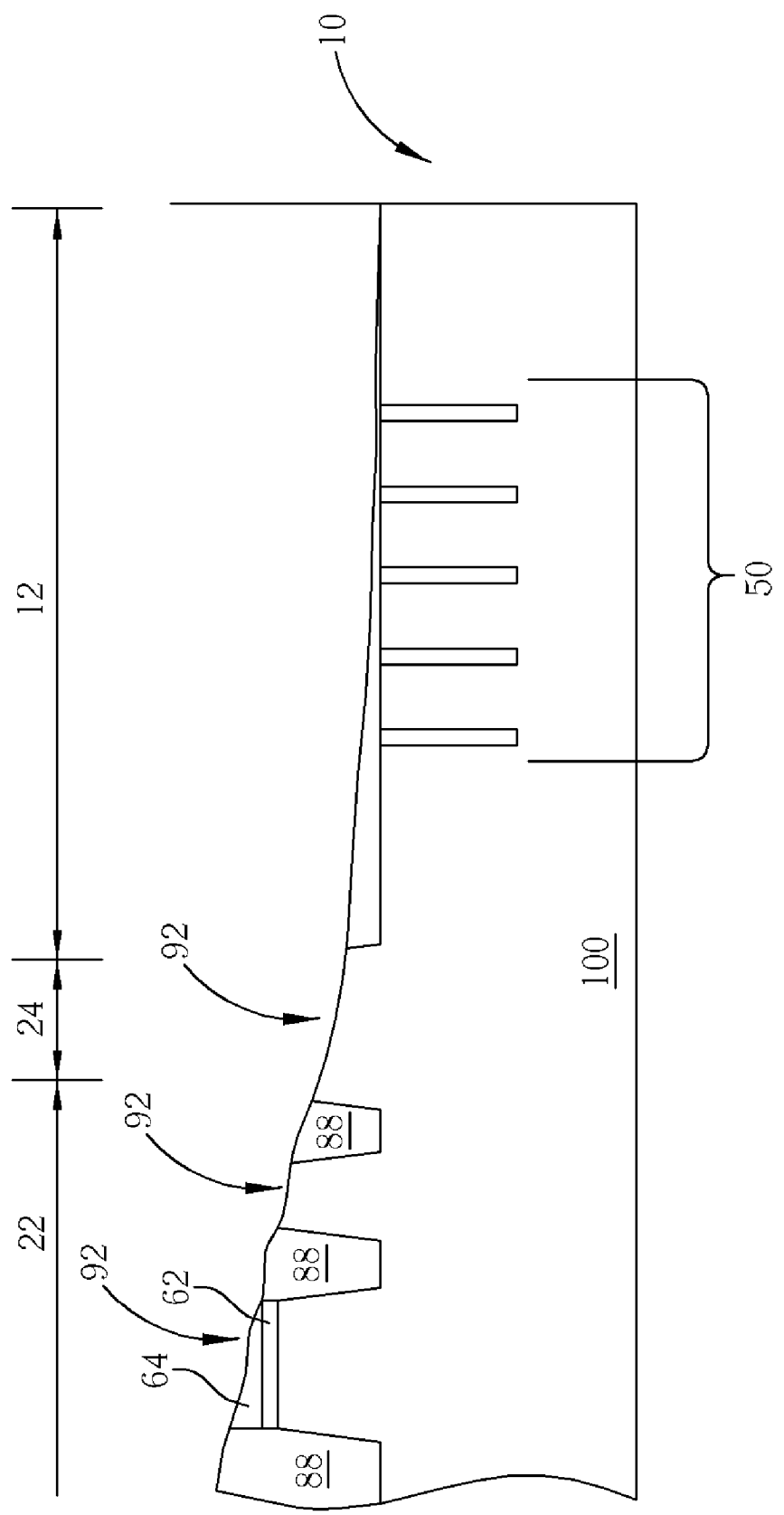

In describing the preferred embodiment of the present invention, reference will be made herein to FIGS. 8-14 of the drawings, wherein like numerals designate like components, areas or regions. Features of the invention are not drawn to scale in the drawings.

Figure 8:
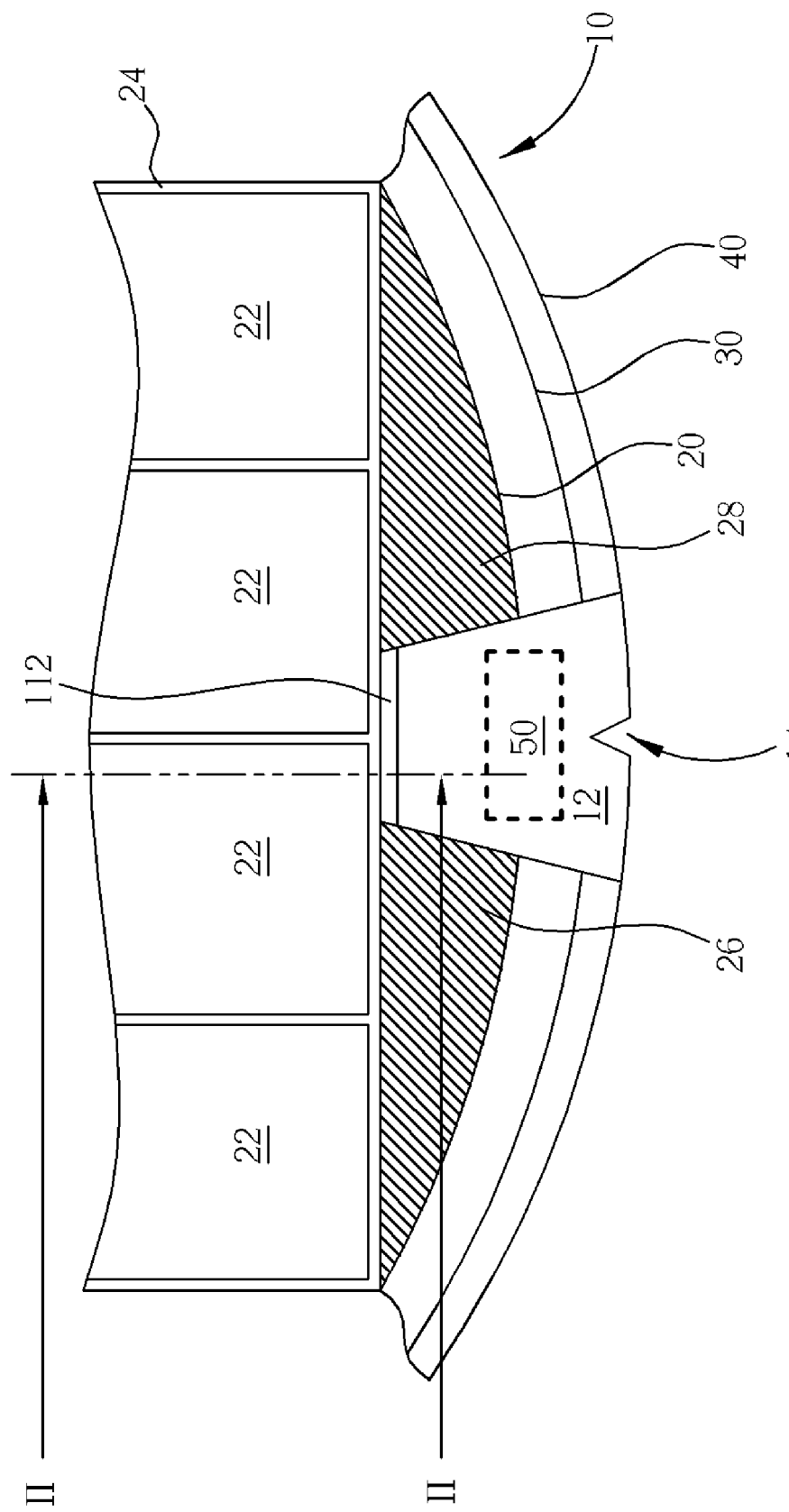
FIG. 8 is an enlarged view showing portions of the integrated circuit die areas and wafer adjacent to the laser mark region according to this invention.

Please refer to FIG. 8. FIG. 8 is a plan view showing portions of integrated circuit die areas 22 and wafer 10 adjacent to the laser mark region 12 according to this invention. As shown in FIG. 8, the laser marking feature 50 representing a lot identifier and a wafer identifier of wafer 10 is made in a laser-marking region 12 at the front surface of the wafer 10. The laser-marking region 12 bounds on the scribe line 24 that surrounds each integrated circuit die area 22, and the boundary between the laser-marking region 12 and the scribe line 24 is about 6.5 millimeters (mm) away from the wafer rim 40. The laser-marking region 12 is disposed at the wafer edge so as not to disrupt the formation of integrated circuits. A wafer notch 14 is formed within the laser-marking region 12. A transitioning region 112, which is a sub-area of the laser-marking region 12, is defined between the laser marking feature 50 and the integrated circuit die area 22.

An edge bead removal (EBR) border 30, which is about 1.5 mm away from the wafer rim 40, and wafer edge exposure (WEE) border 20, which is about 2.5 mm away from the wafer rim 40 are provided. It is known that photoresist and anti-reflective coating (if applied) within an annular peripheral region between the EBR border 30 and the wafer rim 40 are typically chemically washed away during lithographic process for reducing contamination risk. Photoresist within an annular peripheral region or WEE region between the WEE border 20 and the wafer rim 40 is exposed to light and then removed from the wafer periphery after development. According to the prior art, integrated circuit components, features or patterns are typically not formed in the redundancy substrate area 26 at the left-hand side of the laser mark region 12 and in the redundancy substrate area 28 at the right-hand side of the laser mark region 12.

Figure 9:
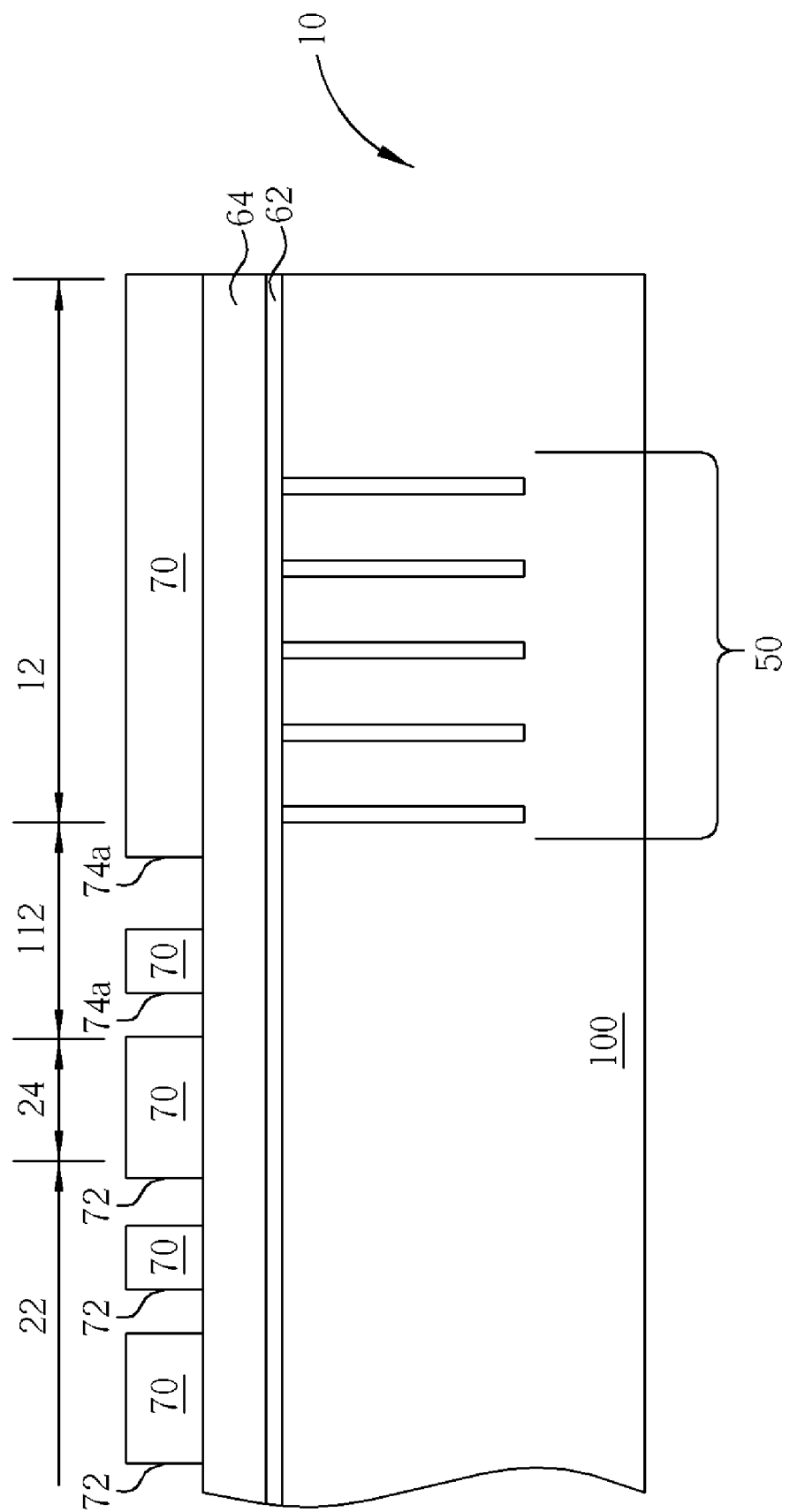
FIGS. 9-14 are schematic cross-sectional diagrams showing portions of the integrated circuit die area and the laser-marking region of the wafer along line II-II of FIG. 8 during the fabrication of STI regions in accordance with the preferred embodiment of this invention.

Please refer to FIGS. 9-14. FIGS. 9-14 are schematic cross-sectional diagrams showing portions of the integrated circuit die area 22 and the laser-marking region 12 of the wafer 10 along line II-II of FIG. 8 during the fabrication of shallow trench isolation (STI) regions in accordance with the preferred embodiment of this invention. In the fabrication of STI regions, an active area (AA) photoresist is patterned and used as a trench dry etching mask. As shown in FIG. 9, a laser marking feature 50, generally a lot identifier and a wafer identifier, is formed in the semiconductor substrate 100 within the laser-marking region 12 of the wafer 10. A pad oxide layer 62 is formed over the semiconductor substrate 100. A pad nitride layer 64 is then deposited on the pad oxide layer 62.

As shown in FIG. 9, using conventional lithographic process, a layer of AA photoresist pattern 70 is formed on the pad nitride layer 64. To form the AA photoresist pattern 70, an even layer of photoresist is spun onto the wafer. This step may also be proceeded by, or include, processes to coat the wafers with one or more ARC/BARC films to improve exposure pattern fidelity. The spin-on process can result in a buildup of photoresist around the edge of the wafer that can break off and create particles in subsequent processing steps. Therefore, the photoresist is removed from the edge of the wafer by either of two processes, edge bead removal (EBR where solvent is dispensed around the wafer edge), or wafer edge exclusion (WEE where the edge of the wafer is exposed to light). The wafer is delivered to a stepper/scanner. In the stepper/scanner, the wafers are carefully aligned and then the light sensitive photoresist is exposed to light through a mask. Depending on the type of photoresist (positive or negative), the exposed or unexposed portion of the photoresist is washed off, leaving a layer of patterned photoresist.

Typically, after the develop step is completed, the wafer is inspected for defects which may have occurred in any of the above-described lithography process areas. Typical defects include problems with photoresist or ARC/BARC coating, edge bead processing, exposure, alignment, and/or development, as well as defects caused by contamination or handling, such as particles or scratches.

The AA photoresist pattern 70 comprises openings 72 that expose STI trench areas within the integrated circuit die area 22 to be etched into the semiconductor substrate 100, and openings 74a that merely exposes a portion of the transitioning region 112 of the laser-marking region 12. According to the preferred embodiment of this invention, except the transitioning region 112, the rest of the laser-marking region 12 is not opened along with the previously described WEE region.

Figure 10:
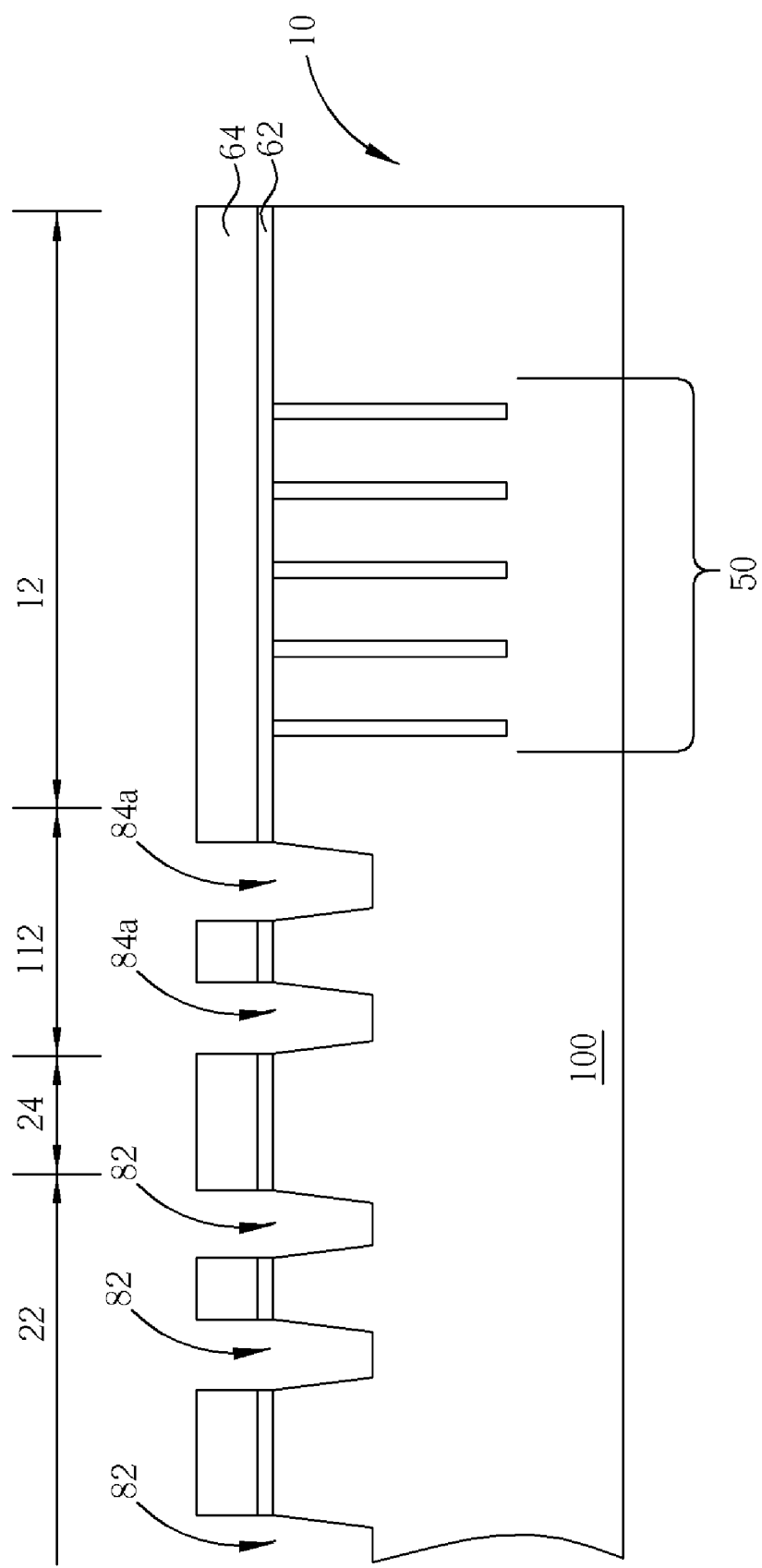
Figure 11:
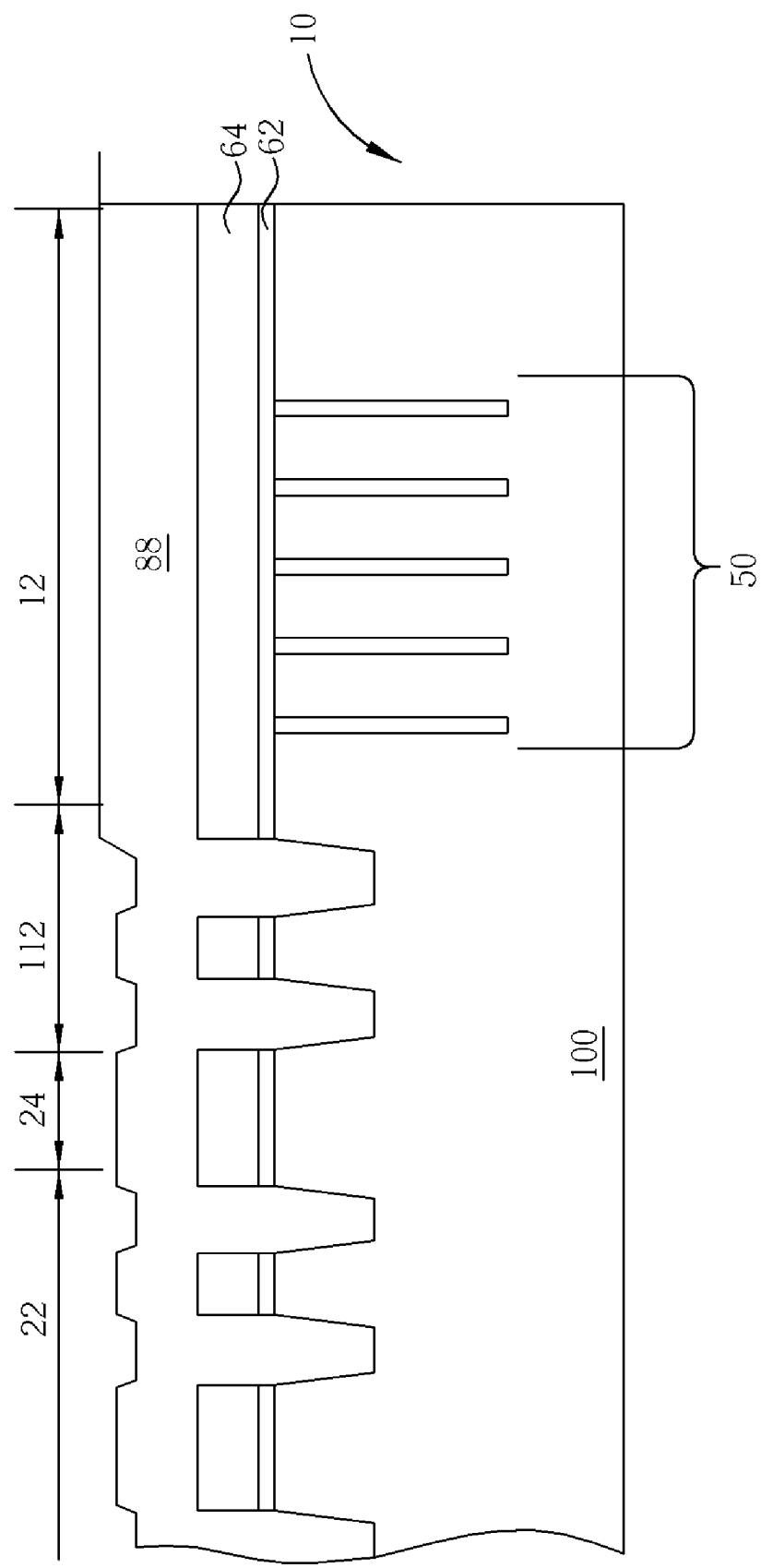

As shown in FIG. 10, using the AA photoresist pattern 70 as an etching hard mask, a dry etching process is carried out to etch the exposed pad nitride layer 64, pad oxide layer 62 and semiconductor substrate 100 through the openings 72 and 74a so as to form STI trenches 82 within the integrated circuit die area 22 and dummy trenches 84a within the transitioning region 112. After this, the remaining AA photoresist pattern 70 is stripped off. As shown in FIG. 11, trench fill material 88 such as CVD oxide is deposited over the semiconductor substrate 100 to fill the trenches 82 and 84a. Since the most of the area of the laser-marking region 12 is not opened, the topmost surface of the trench fill material 88 that is directly above the laser-marking region 12 is higher than that above the integrated circuit die area 22. An step height of the trench fill material 88 can be observed at the transitioning region 112.

Figure 12:
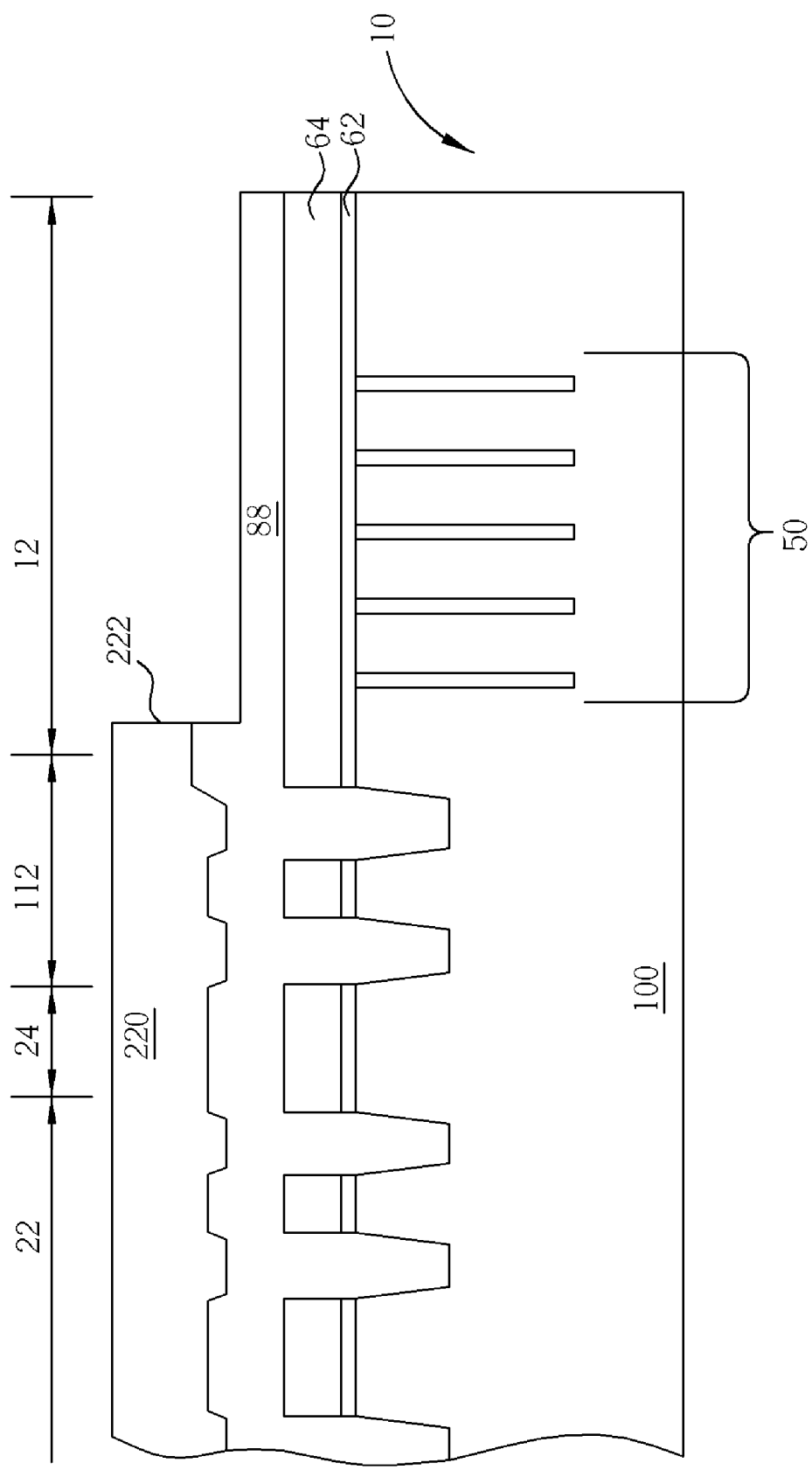

As shown in FIG. 12, a reverse mask 220 having an opening 222 that exposes the laser-marking region 12 except the transitioning region 112 is provided on the trench fill material 88. Using the reverse mask 220 as an etching hard mask, a dry etching process is then carried out to etch the trench fill material 88 through the opening 222. This step ensures that the trench fill material 88 directly above the laser-marking region 12 can be completely removed from the surface of the pad nitride layer 64 in the subsequent CMP process without excessive over-polishing or etching. The reverse mask 220 is then stripped off.

Figure 13:
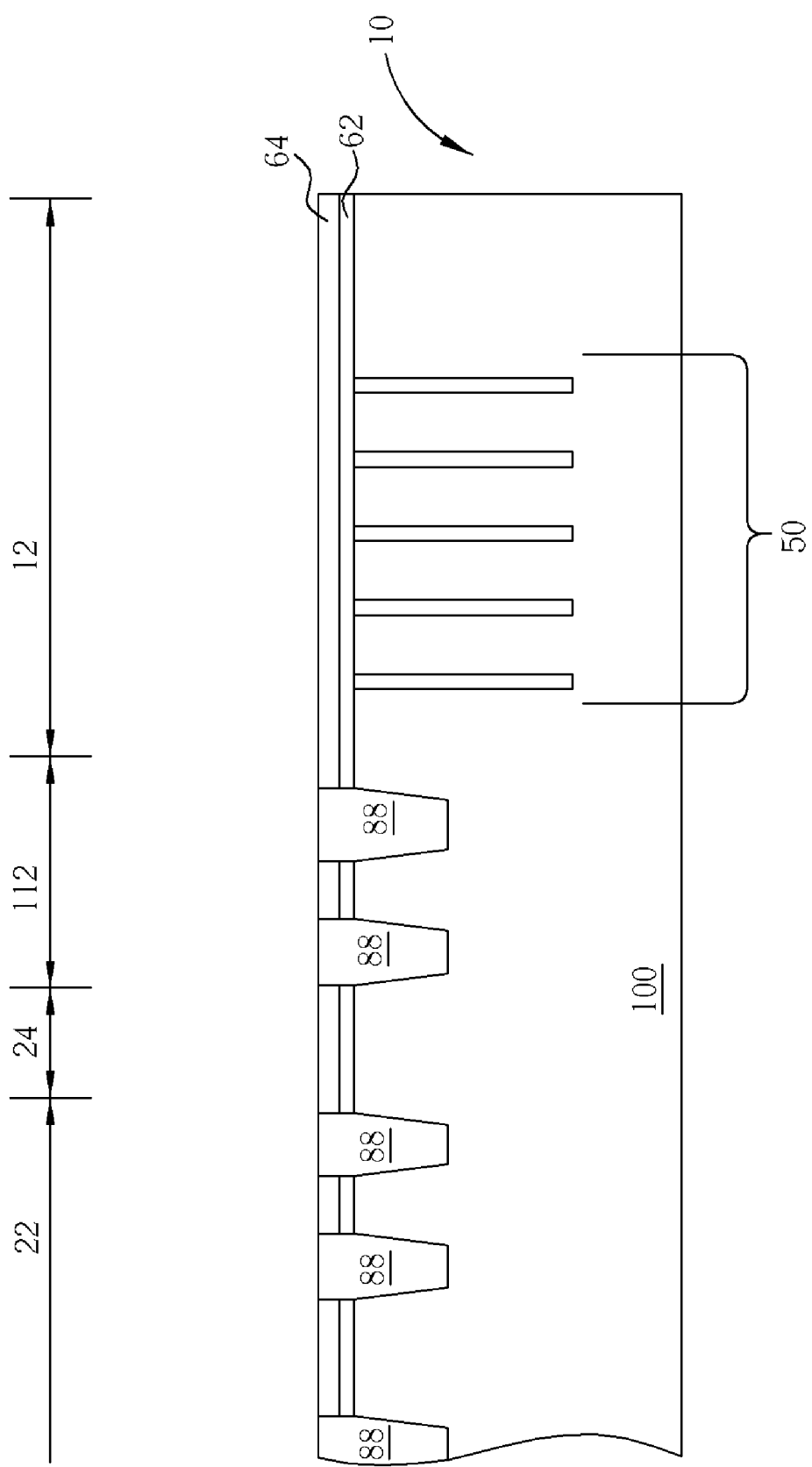

As shown in FIG. 13, using the pad nitride layer 64 as a polish stop, a conventional STI chemical mechanical polishing (CMP) process is carried out to remove excess trench fill material 88 outside the STI trenches 82 and 84a. During the STI CMP process, the active-area oxide disposed directly above the pad nitride layer 64 is completely removed to facilitate the subsequent pad nitride strip. Overpolishing is conducted. Since the most of the area of the laser-marking region 12 is masked by the pad nitride layer 64, no silicon damage is observed in the integrated circuit die area 22 that is disposed near the laser-marking region 12.

Figure 14:
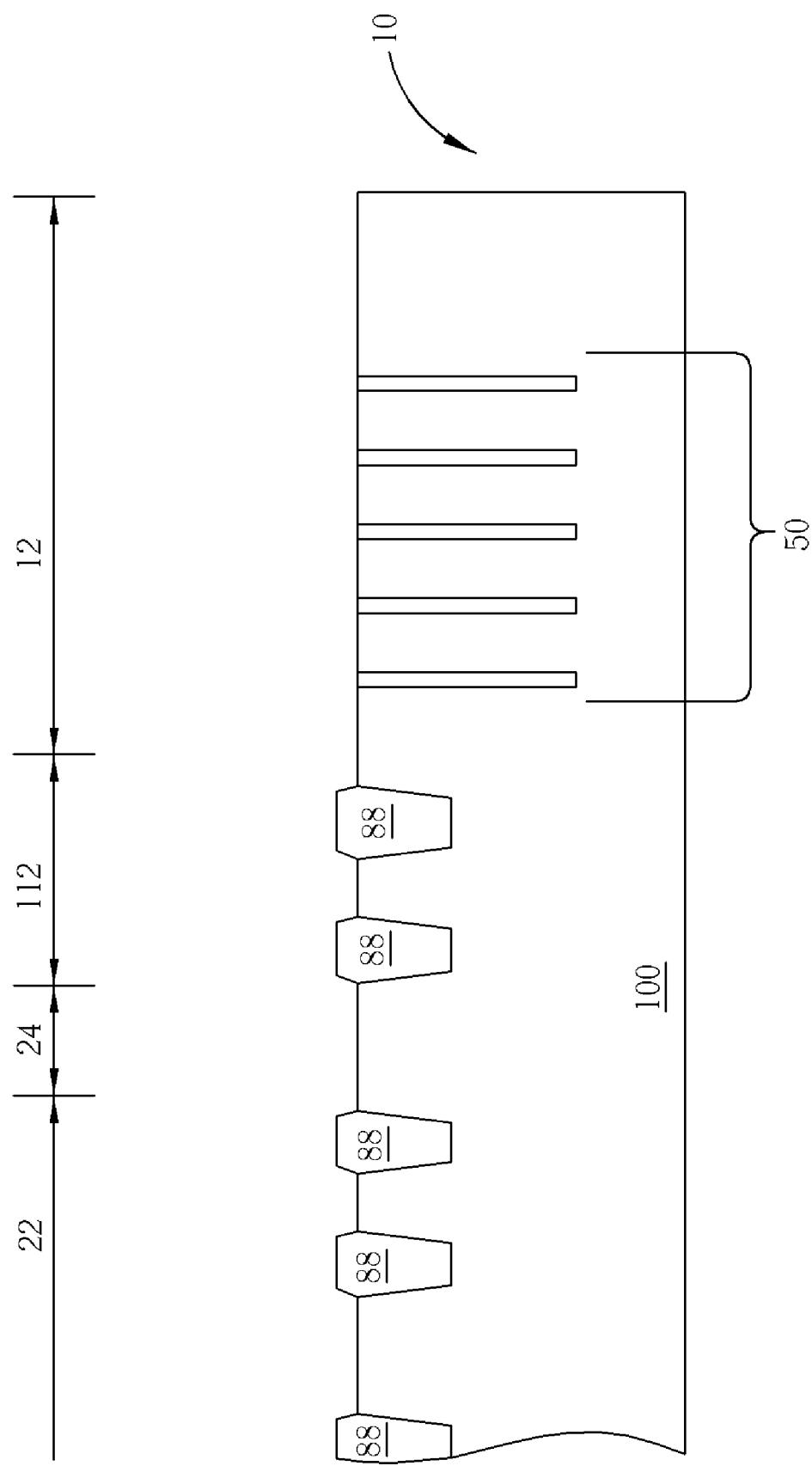

As shown in FIG. 14, the remaining pad nitride layer 64 and the pad oxide layer 62 are removed from the surface of the wafer 10 using methods known in the art. The present invention features the partial exposure of the laser-marking region 12 during the STI definition process. Circuit patterns (STI trench) that are analogous to a portion of the circuit patterns of each integrated circuit die area 22 are formed in the transitioning region 112 that does not overlap with the laser marking feature 50. According to another preferred embodiment, and referring briefly back to FIG. 8, the circuit trench patterns that are analogous to a portion of the circuit patterns of each integrated circuit die area 22 may be formed in the redundancy substrate area 26 at the left-hand side of the laser mark region 12 and in the redundancy substrate area 28 at the right-hand side of the laser mark region 12.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of reducing silicon damage around laser marking region of wafers in shallow trench isolation (STI) chemical mechanical polishing (CMP) process, comprising:
   providing a wafer having thereon a plurality of integrated circuit die areas, scribe line that surrounding each of the integrated circuit die areas, and a laser marking region having therein a laser marking feature, wherein the laser marking region is disposed at wafer edge and is adjacent to the scribe line;
   forming a pad oxide layer on the wafer;
   forming a pad nitride layer on the pad oxide layer;
   forming an active area (AA) photoresist pattern on the pad nitride layer, the AA photoresist pattern comprises trench openings that expose STI trench areas within the integrated circuit die areas to be etched into a substrate of the wafer, and dummy openings that merely expose a transitioning region of the laser-marking region;
   using the AA photoresist pattern as etching hard mask, etching the pad nitride layer, the pad oxide layer and the substrate through the trench openings and dummy openings, so as to form STI trenches within the integrated circuit die areas and dummy trenches in the transitioning region of the laser-marking region;
   removing the AA photoresist pattern;
   depositing a trench fill dielectric over the wafer the trench fill dielectric filling the STI trenches and the dummy trenches;
   forming a reverse mask having an opening exposing the laser-marking region except the transitioning region;
   etching the trench fill dielectric though the opening of the reverse mask to reduce thickness of the trench fill dielectric above the laser marking feature;
   removing the reverse mask; and
   using the pad nitride layer as a polish stop layer, chemical mechanical polishing the trench fill dielectric.

2. The method of claim 1 wherein the transitioning region is a sub-area of the laser-marking region, and is defined between the laser marking feature and the integrated circuit die area.

3. The method of claim 1 wherein boundary between the laser-marking region and the scribe line is about 6.5 millimeters (mm) away from rim of the wafer.

4. The method of claim 1 wherein the trench fill dielectric is chemical vapor deposition (CVD) oxide.

5. A method of reducing silicon damage around laser marking region of wafers in shallow trench isolation (STI) chemical mechanical polishing (CMP) process, comprising:
   providing a wafer having thereon a plurality of integrated circuit die areas, scribe line that surrounding each of the integrated circuit die areas, and a laser marking region having therein a laser marking feature, wherein the laser marking region is disposed at wafer edge and is adjacent to the scribe line;

forming a pad layer on the wafer;

forming an active area (AA) photoresist pattern on the pad layer, the AA photoresist pattern comprises trench openings that expose STI trench areas within the integrated circuit die areas to be etched into a substrate of the wafer, and dummy openings that merely expose a transitioning region of the laser-marking region;

using the AA photoresist pattern as etching hard mask, etching the pad layer and the substrate through the trench openings and dummy openings, so as to form STI trenches within the integrated circuit die areas and dummy trenches in the transitioning region of the laser-marking region, wherein the dummy trenches do not overlap the laser marking feature;

removing the AA photoresist pattern;

depositing a trench fill dielectric over the wafer, the trench fill dielectric filling the STI trenches and the dummy trenches;

using the pad layer as a polish stop layer, chemical mechanical polishing the trench fill dielectric; and stripping the pad layer.

6. The method of claim 5 wherein the transitioning region is a sub-area of the laser-marking region, and is defined between the laser marking feature and the integrated circuit die area.

7. The method of claim 5 wherein the pad layer comprises a pad oxide layer and pad nitride layer.

8. The method of claim 5 wherein the trench fill dielectric is chemical vapor deposition (CVD) oxide.

* * * * *